US012387951B2

(12) United States Patent
Hu

(10) Patent No.: US 12,387,951 B2
(45) Date of Patent: Aug. 12, 2025

(54) SEMICONDUCTOR DEVICE WITH LIGHT TRANSMITTANCE ADJUSTMENT PLATE AND PROCESSING METHOD THEREFOR, AND METHOD FOR MEASURING TEMPERATURE

(71) Applicant: CHANGXIN MEMORY TECHNOLOGIES, INC., Hefei (CN)

(72) Inventor: Meng Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 752 days.

(21) Appl. No.: 17/750,452

(22) Filed: May 23, 2022

(65) Prior Publication Data
US 2023/0377920 A1 Nov. 23, 2023

Related U.S. Application Data

(63) Continuation of application No. PCT/CN2022/081426, filed on Mar. 17, 2022.

(30) Foreign Application Priority Data

Jan. 14, 2022 (CN) .......................... 202210042732.1

(51) Int. Cl.
*H01L 21/67* (2006.01)
*H01L 21/324* (2006.01)
(Continued)

(52) U.S. Cl.
CPC ...... *H01L 21/67248* (2013.01); *H01L 21/324* (2013.01); *H05B 1/0233* (2013.01); *H05B 3/0047* (2013.01)

(58) Field of Classification Search
CPC ............. H01L 21/67248; H01L 21/324; H01L 21/67115; H05B 1/0233; H05B 3/0047; F27D 11/12; F27B 17/0025
See application file for complete search history.

(56) References Cited

U.S. PATENT DOCUMENTS 8,658,945 B2 * 2/2014 Aderhold .......... H01L 21/67115
118/724
2012/0070136 A1 * 3/2012 Koelmel .................. F27B 5/18
392/416
(Continued)

FOREIGN PATENT DOCUMENTS

CN 105374717 B 3/2019
JP 2017092095 A * 5/2017

OTHER PUBLICATIONS

Kang Yongqiang etc. "Research and Test Oil the Experiment of Black-body Radiation", Physical Experiment of College, vol. 23 No. 4, Aug. 2010, 4 pages.

*Primary Examiner* — John P. Dulka
(74) *Attorney, Agent, or Firm* — Kilpatrick Townsend & Stockton LLP

(57) ABSTRACT

A semiconductor device and a processing method therefor, and a method for measuring temperature are provided. The semiconductor device includes a chamber, including a bearing component configured to place a wafer; a heat supply assembly configured to supply a heat source to the chamber; an adjustment plate; and a temperature measuring assembly configured to receive heat radiation and output a temperature measured according to the received heat radiation. The adjustment plate has a first light transmittance when the wafer is placed on the bearing component, and the temperature measuring assembly receives the heat radiation that is emitted by the wafer and passes through the adjustment plate. The adjustment plate has a second light transmittance different from the second light transmittance when the wafer is not placed on the bearing component, and the temperature measuring assembly receives the heat radiation emitted by the adjustment plate.

19 Claims, 10 Drawing Sheets

(51) Int. Cl.
  *H05B 1/02* (2006.01)
  *H05B 3/00* (2006.01)

(56) References Cited

U.S. PATENT DOCUMENTS

2016/0262207 A1* 9/2016 Abe .................... F27B 17/0025
2022/0277972 A1* 9/2022 Onishi .............. H01L 21/67248
2024/0332045 A1* 10/2024 Yoshioka .......... H01L 21/67115

* cited by examiner

SEMICONDUCTOR DEVICE WITH LIGHT TRANSMITTANCE ADJUSTMENT PLATE AND PROCESSING METHOD THEREFOR, AND METHOD FOR MEASURING TEMPERATURE

CROSS-REFERENCE TO RELATED APPLICATION

This is a continuation application of International Patent Application No. PCT/CN2022/081426, filed on Mar. 17, 2022, which claims priority to Chinese patent application No. 202210042732.1, filed on Jan. 14, 2022 and entitled "SEMICONDUCTOR DEVICE AND PROCESSING METHOD THEREFOR, AND METHOD FOR MEASURING TEMPERATURES". The disclosures of International Patent Application No. PCT/CN2022/081426 and Chinese patent application No. 202210042732.1 are incorporated by reference herein in their entireties.

TECHNICAL FIELD

The present disclosure relates to the technical field of semiconductors, and in particular, to a semiconductor device and a processing method therefor, and a method for measuring temperature.

BACKGROUND

The Rapid Thermal Processing (RTP) is a manufacturing process widely used in the semiconductor manufacturing industry. An RTP device is generally provided with a thermometer with fast reaction time and long service life, to perform the temperature measurement. During use, the thermometer may measure the temperature by detecting heat radiation of a silicon wafer.

However, when there is no wafer placed in a chamber of the RTP device, the temperature measurement of the thermometer of the RTP device in the related art cannot represent a real temperature of the chamber of the RTP device. The intensity of a light source of the RTP device is adjusted according to the temperature measurement of the thermometer, and if the temperature measurement is inaccurate, the wafer will be bent to a large extend during a subsequent heat treatment, which affects product quality, and even causes the scrapping of products.

SUMMARY

A first aspect of the present disclosure provides a semiconductor device, including a chamber, a heat supply assembly, an adjustment plate, a temperature measuring assembly.

The chamber includes a bearing component configured to place a wafer to be processed.

The heat supply assembly is located above the chamber and configured to supply heat to the chamber.

The adjustment plate is located in the chamber and under the bearing component.

The temperature measuring assembly is located under the adjustment plate, and configured to receive heat radiation and output a temperature measured according to the received heat radiation.

The adjustment plate has a first light transmittance when the wafer to be processed is placed on the bearing component, and the temperature measuring assembly is configured to receive the heat radiation that is emitted by the wafer to be processed and passes through the adjustment plate. The adjustment plate has a second light transmittance when the wafer to be processed is not placed on the bearing component, and the temperature measuring assembly is configured to receive the heat radiation emitted by the adjustment plate. The first light transmittance is different from the second light transmittance.

A second aspect of the present disclosure further provides a method for measuring temperature, applied in the above semiconductor device, the method includes the following operation of:

acquiring an output temperature of the temperature measuring assembly in a case that the wafer to be processed is not placed on the bearing component. The output temperature characterizes a temperature at which the wafer to be processed is heated when the wafer to be processed is placed on the bearing component.

A third aspect of the present disclosure further provides a processing method for the above semiconductor device. The processing method includes the following operations of:

receiving the first instruction indicating that the semiconductor device is about to perform a process for processing a semiconductor;

setting a heat supply assembly at a first power;

acquiring a first output temperature of the temperature measuring assembly in a case that the wafer to be processed is not placed on the bearing component; and determining, according to the state of the first output temperature, whether the semiconductor device can directly perform the process for processing a semiconductor.

DETAILED DESCRIPTION

Figure 1A:
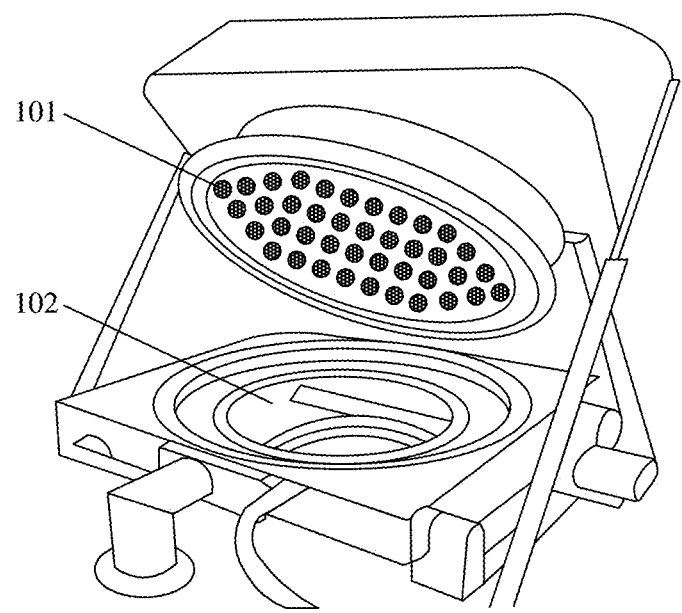
FIG. 1A is a partial schematic perspective view of an RTP device according to an embodiment of the present disclosure.

Exemplary embodiments disclosed in the present disclosure are described in more detail with reference to drawings. Although the exemplary embodiments of the present disclosure are shown in the drawings, it should be understood that the present disclosure may be implemented in various forms and should not be limited by the specific embodiments described here. On the contrary, these embodiments are provided for more thorough understanding of the present disclosure, and to fully convey a scope disclosed in the embodiments of the present disclosure to a person skilled in the art.

In the following descriptions, a lot of specific details are given in order to provide the more thorough understanding of the present disclosure. However, it is apparent to a person skilled in the art that the present disclosure may be implemented without one or more of these details. In other examples, in order to avoid confusion with the present disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It should be understood that, spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the present disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

It is to be noted that terms "first", "second" and the like are used for distinguishing similar objects rather than describing a specific sequence or a precedence order.

In order to understand the features and technical contents of the embodiments of the present disclosure in more detail, the implementation of the embodiments of the present disclosure are described in detail below with reference to the drawings, which are for reference only and are not intended to limit the embodiments of the present disclosure.

It should be noted that, a semiconductor device involved in an embodiment of the present disclosure includes, but is not limited to, a Rapid Thermal Processing (RTP) device. It should be understood that, the semiconductor device involved in this embodiment of the present disclosure may be applied to other semiconductor devices that have a heating function, measures the temperature by the principle of heat radiation, and have the problem that temperature measured by a temperature measuring assembly cannot reflect real temperature of a chamber when there is no wafer in a chamber of the device. For the concise and distinct of the description, the RTP device is used as an example for description below.

The RTP device is briefly described below.

Figure 1B:
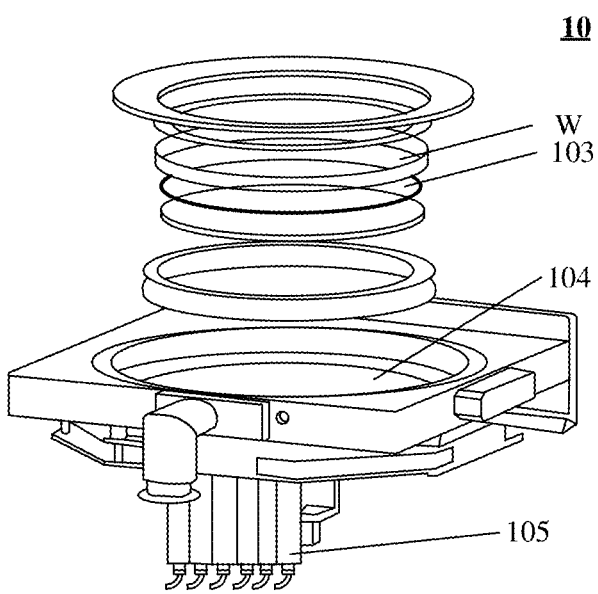
FIG. 1B is a partial exploded schematic view of an RTP device according to an embodiment of the present disclosure.

FIG. 1A is a partial schematic perspective view of an RTP device according to an embodiment of the present disclosure. FIG. 1B is a partial exploded schematic view of an RTP device according to an embodiment of the present disclosure. As shown in FIG. 1A and FIG. 1B, the RTP device 10 includes a plurality of halogen lamps 101, a chamber 102, a quartz cover plate 103, a reflective plate 104, and an optical thermometer 105. The plurality of halogen lamps 101 are located above the chamber, and configured to provide a heat source (that is, short wavelength radiation) for the chamber 102. The chamber 102 includes a bearing component configured to carry a wafer W to be processed, and a thermal processing operation will be performed on the wafer W to be processed in the chamber. The reflective plate 104 is located under the wafer to be processed, and configured to reflect heat radiation emitted by the wafer back to the wafer, so as to maintain a uniform temperature. The quartz cover plate 103 is located under the bearing component, and configured to prevent a product of the reaction on the wafer from being attached onto surfaces of the reflective plate 104 and the optical thermometer 105. The attachment of the product may result in shortened chamber maintenance cycle and inaccurate detection of a surface temperature of the wafer. The optical thermometer 105 is located under the reflective plate 104, and configured to receive the heat radiation and output a temperature measured according to the received heat radiation.

Figure 2:
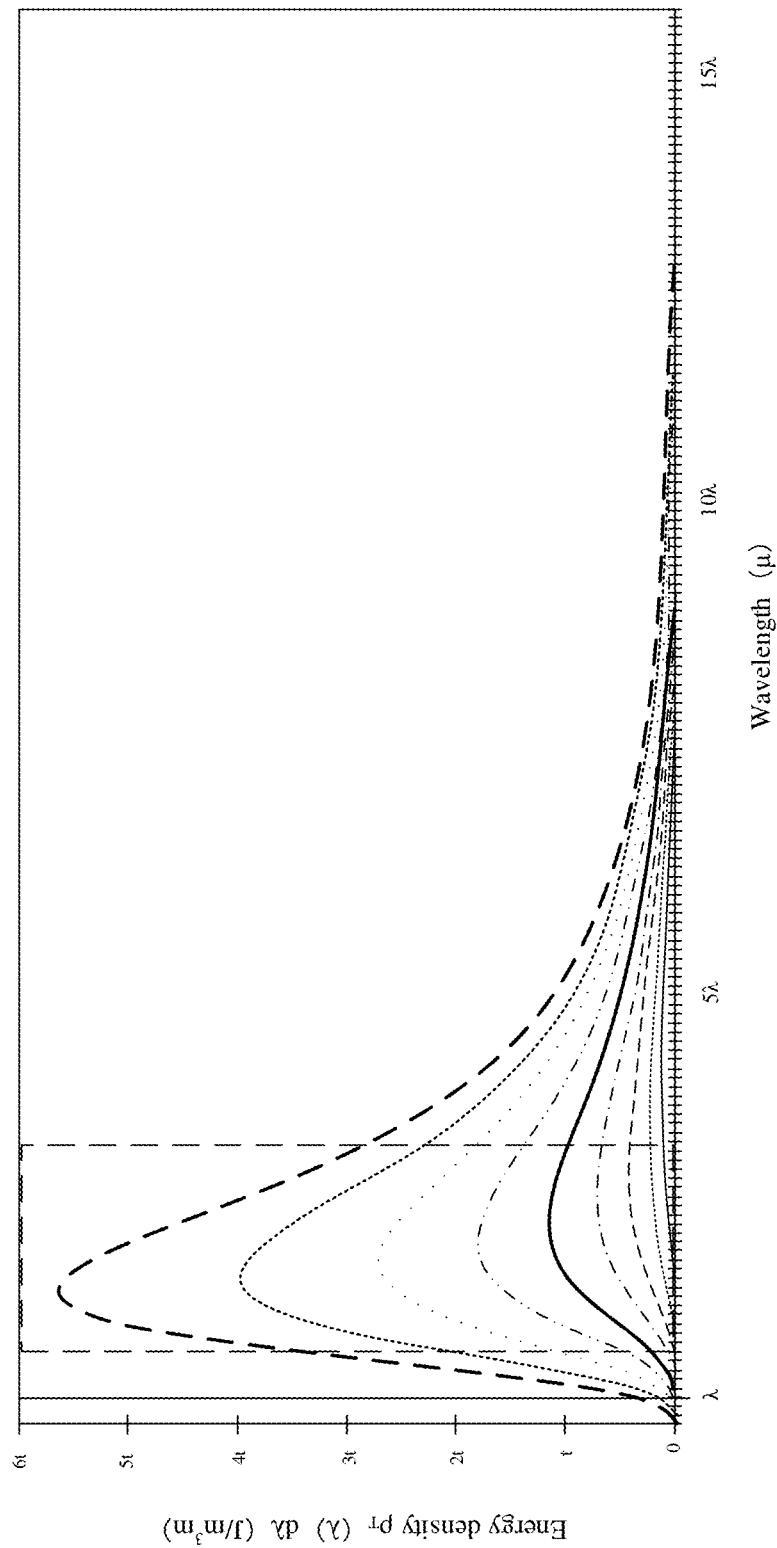
FIG. 2 is a schematic view showing a function relationship curve of Planck blackbody radiation energy density with respect to a wavelength at different temperatures according to an embodiment of the present disclosure.

The optical thermometer 105 evaluates an actual temperature of the chamber by detecting radiation energy density under short wavelengths. FIG. 2 is a schematic diagram of a function relationship curve of Planck blackbody radiation energy density with respect to a wavelength at different temperatures according to an embodiment of the present disclosure. In FIG. 2, temperatures for the curves from bottom to top are T1, T2, T3, T4, T5, T6, T7, T8, and T9 respectively. For example, T1 may be 400° C., T2 may be 500° C., T3 may be 600° C., T4 may be 700° C., T5 may be 800° C., T6 may be 900° C., T7 may be 1000° C., T8 may be 1100° C., and T9 may be 1200° C. $\lambda$ in a horizontal coordinate and t in a vertical coordinate in FIG. 2 may be adjusted according to actual situations.

Figure 3:
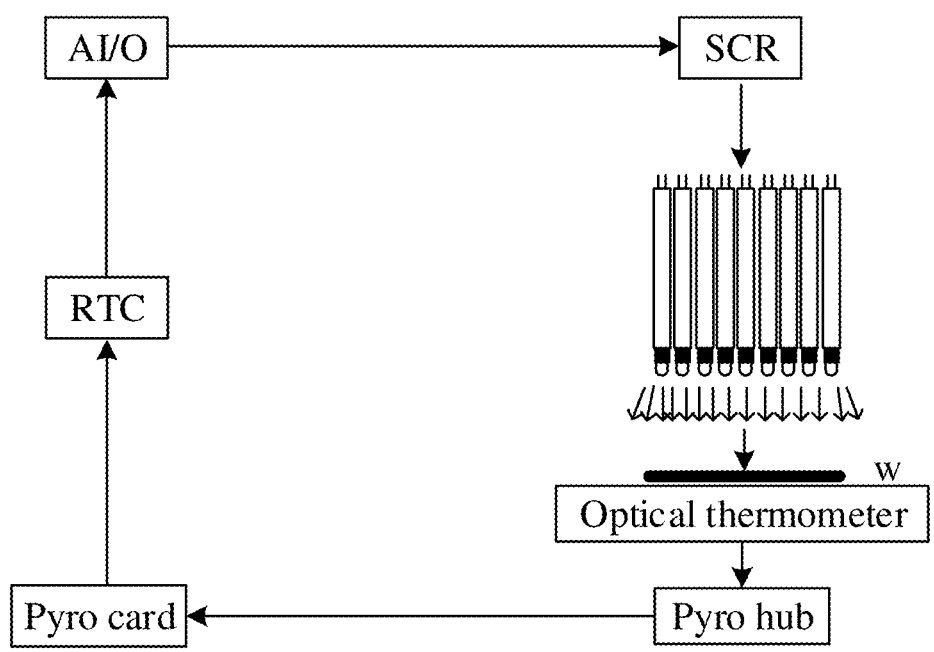
FIG. 3 is a schematic flowchart showing temperature adjustment of an RTP device according to an embodiment of the present disclosure.

FIG. 3 is a schematic flowchart showing temperature adjustment of an RTP device according to an embodiment of the present disclosure. As shown in FIG. 3, an Analog Input/output (AI/O) interface receives a signal from a Real Time Controller (RTC), and transmits a control instruction to a Silicon Controlled Rectifier (SCR). The SCR supplies and controls a power of the halogen lamp. The halogen lamp emits light to the wafer. The optical thermometer detects a light source. A Pyrometer Hub (Pyro hub) integrates detected signals. A Pyrometer Card (Pyro card) converts the detected signals into an actual temperature and transmits it to the RTC. The RTC compares a target temperature value in a manufacturing process with an actual temperature measured by the Pyro card, and transmits the control instruction to the AI/O according to a comparison result.

From the above process of adjusting the temperature, it may be understood that, the intensity of the light supplied by the halogen lamp is adjusted according to temperature measurement of the optical thermometer. When the temperature measurement of the optical thermometer is inaccurate, a temperature applied to the wafer during the thermal processing of the wafer will be inconsistent with a temperature actually required, resulting in over-bending of the wafer, thereby affecting product quality and even directly causing the scrapping of products. Based on this, it is very important to calibrate the optical thermometer.

The optical thermometer 105 is generally calibrated before the wafer to be processed W is placed in a chamber in the RTP device. That is to say, when the optical thermometer 105 is calibrated, there is no wafer in the chamber. The quartz cover plate 103 is generally transparent. When there is no wafer in the chamber, light of the halogen lamp directly penetrates the quartz cover plate 103, which results in that temperature measurement of the optical thermometer is inaccurate and the measured temperature is relatively high, thereby obtaining an incorrect temperature measurement.

Figure 4A:
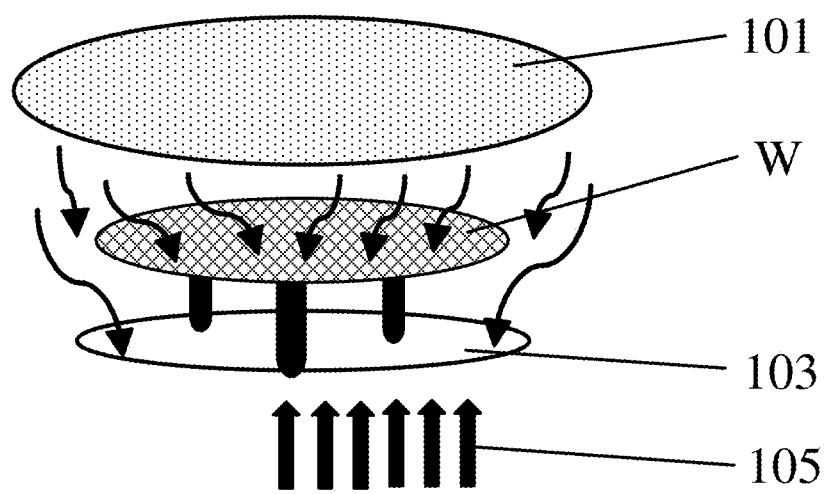
FIG. 4A is a schematic view showing the impact of rising of a lifting pin of an RTP device on temperature measurement of an optical thermometer according to an embodiment of the present disclosure.
Figure 4B:
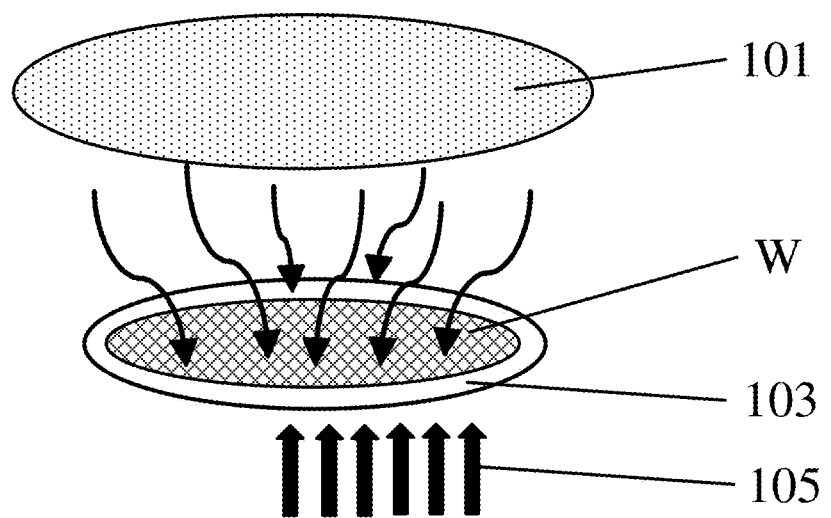
FIG. 4B is a schematic view showing the impact of retracting of the lifting pin of the RTP device on temperature measurement of the optical thermometer according to an embodiment of the present disclosure.

Even if there is a wafer placed in the chamber, light leakage is occurred when a lifting pin configured to place the wafer to be processed W is risen, so that inaccurate temperature measurement of the optical thermometer 105 is caused, and the incorrect measured temperature is obtained. When there is a wafer placed in the chamber and the lifting pin configured to place the wafer to be processed W is not risen (i.e. is retracted), light leakage does not occur since the quartz cover plate 103 is covered by the wafer. In this case, the temperature measurement of the optical thermometer 105 is accurate. Processes of rising and retracting the lifting pin are shown in FIGS. 4A and 4B.

When a maximum power of the halogen lamp is 9% and there is a wafer in the chamber, a temperature value measured by the optical thermometer is relatively accurate, which is about t1° C. When there is no wafer placed in the chamber, the temperature value measured by the optical thermometer has a large deviation from an accurate value, which may be about 2t1° C. to 6t1° C.

To sum up, during the using of the RTP device, when there is no wafer placed in the chamber, there are problems that real temperature of the chamber cannot be monitored and the temperature measurement of the optical thermometer cannot be calibrated in a non-maintenance period.

In order to resolve at least one of the above problems, an embodiment of the present disclosure provides another semiconductor device, including a chamber, a heat supply assembly, an adjustment plate, a temperature measuring assembly.

The chamber includes a bearing component configured to place a wafer to be processed.

The heat supply assembly is located above the chamber and configured to supply a heat to the chamber.

The adjustment plate is located in the chamber and under the bearing component.

The temperature measuring assembly is located under the adjustment plate, and configured to receive heat radiation and output a temperature measured according to the received heat radiation.

The adjustment plate has a first light transmittance when the wafer to be processed is placed on the bearing component, and the temperature measuring assembly receives the heat radiation emitted by the wafer to be processed and penetrating the adjustment plate. The adjustment plate has a second light transmittance when the wafer to be processed is not placed on the bearing component, and the temperature measuring assembly receives the heat radiation emitted by the adjustment plate. The first light transmittance is different from the second light transmittance.

Figure 5A:
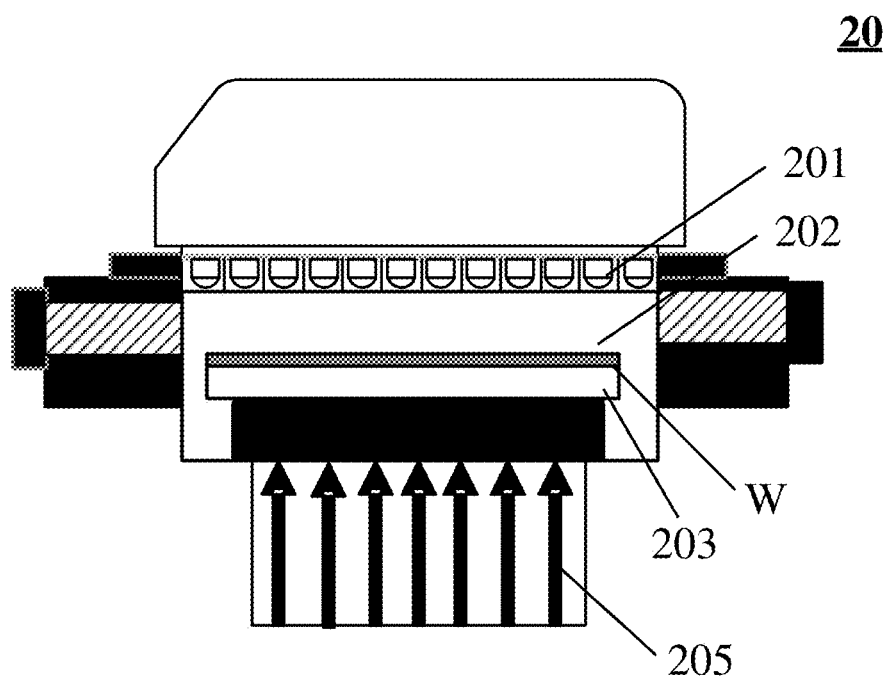
FIG. 5A is a schematic cross-sectional view showing that there is a wafer in a chamber of another RTP device according to an embodiment of the present disclosure.
Figure 5B:
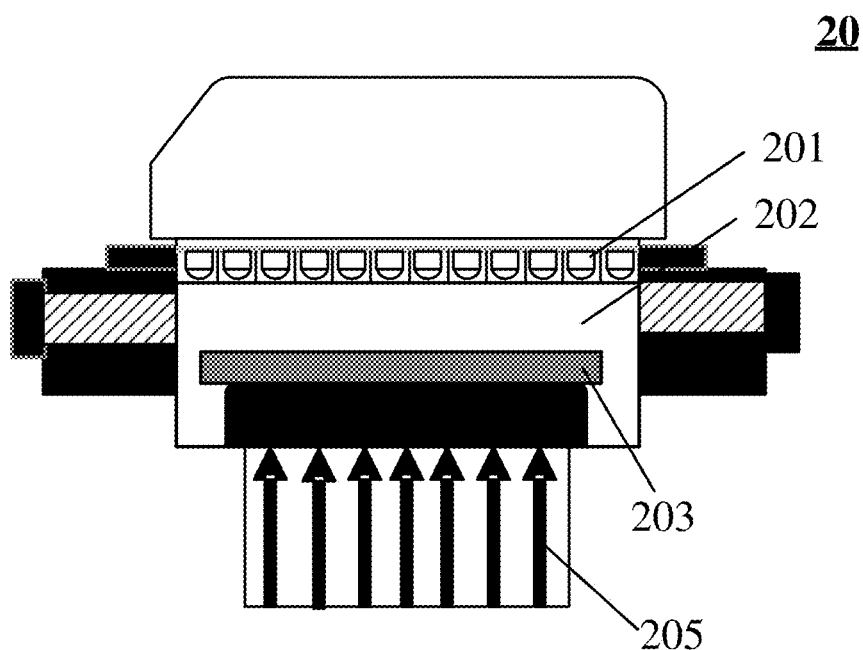
FIG. 5B is a schematic cross-sectional view showing that there is no wafer in the chamber of another RTP device according to an embodiment of the present disclosure.

In some embodiments, the semiconductor device may include an RTP device. FIGS. 5A and 5B are schematic cross-sectional views of another RTP device according to an embodiment of the present disclosure. Another semiconductor device provided in this embodiment of the present disclosure is described in detail below by using FIGS. 5A and 5B as examples.

Herein, the chamber 202 is a site where the semiconductor device 20 subjected to the thermal processing. The chamber includes a bearing component (not shown in FIGS. 5A and 5B) configured to carry a wafer to be processed W.

Exemplarily, the wafer to be processed W (for example, a silicon wafer) is placed on an annular bearing component in the chamber 202 through a valve or an access port.

Herein, the heat supply assembly 201 is arranged above the chamber 202 to guide radiant energy to face towards the wafer to be processed W, so as to heat the wafer to be processed W. In other words, the heat supply assembly 201 may provide a light source and heat source. The heat supply assembly 201 may include a plurality of high-intensity halogen lamps arranged in the chamber 202. The plurality of halogen lamps are arranged in a dense hexagonal array.

In some embodiments, the heat supply assembly 201 may include at least one of a halogen lamp, an ultraviolet lamp, a laser diode, a resistance heater, a microwave power heater, a light emitting diode, a quartz lamp, an arc lamp, a resistance wire, or a heating wire.

The heat supply assembly 201 may be divided into a plurality of areas. Each of the areas may be in a ring-like shape around a central axis of the chamber 202. A control circuit may change voltages transmitted to different areas of the heat supply assembly 201, so as to adjust the radiation distribution of the radiation energy.

It is to be noted that, a temperature provided by the heat supply assembly 201 is different from a heating temperature for the wafer to be processed W. Generally, the temperature provided by the heat supply assembly 201 is greater than the heating temperature for the wafer to be processed W. In order to measure the temperature of the wafer to be processed W when the wafer to be processed W is placed on the bearing component in the chamber, the adjustment plate 203 is required to have a great light transmittance, so that the light radiated by the wafer to be processed W may pass through the adjustment plate 203 and then may be detected by the temperature measuring assembly 205. In this case, the temperature measuring assembly 205 can measure the temperature of the wafer to be processed W. However, if the light transmittance of the adjustment plate 203 is always great and the wafer to be processed W is not placed on the bearing component, the light radiated by the heat supply assembly 201 passes through the adjustment plate 203 and is detected by the temperature measuring assembly 205. In this case, the temperature measured by the temperature measuring assembly 205 cannot reflect an actual temperature of the reaction chamber or the temperature at which the wafer to be processed W is heated during subsequent annealing, but reflects the temperature of the heat supply assembly 201, so that the temperature is higher than the temperature of the chamber.

Based on this, in this embodiment, the light transmittance of the adjustment plate 203 located in the chamber 202 and under the bearing component is variable according to actual requirements. In some embodiments, a material of the adjustment plate 203 includes a ceramic material and a photochromic material. The light transmittance of the adjustment plate 203 changes according to different wavelengths of the light acted on the adjustment plate 203.

The ceramic material includes optically transparent ceramic. The adjustment plate 203 is manufactured by adding the photochromic material (also known as photochromics) in the ceramic material. The absorption coefficient of the photochromic material is variable, and may change from one structure to another structure under the action of light sources with different wavelengths, to cause a reversible change in a color of the ceramic material. Therefore, by the change in the color of the adjustment plate, a real temperature in the chamber may be detected by the temperature measuring assembly when there is no wafer in the chamber.

In some embodiments, the ceramic material includes at least one of quartz, alumina, silicon carbide, or sapphire. The photochromic material includes at least one of an acetylenic compound, spiropyrane, spirooxazine, a triarylmethane compound, hexaphenyl biimidazole, a salicylaldehyde aniline compounds, a perinaphthene indigo dye, an azo compound, a fused ring aromatic compound, thiazides, fulgide, or diarylethene.

In some embodiments, the photochromic material is located on a surface of the ceramic material, or the photochromic material is doped in the ceramic material.

A photochromic material coating may be deposited on the surface of the ceramic material, or the photochromic material may be doped in the ceramic material.

Due to the different wavelengths of the light acted on the adjustment plate 203, the light transmittance of the adjustment plate 203 is changed, which will be further explained and described below.

As shown in FIG. 5A, when there is a wafer covering the adjustment plate 203 in the chamber 202, a side of the adjustment plate 203 adjacent to the heat supply assembly 201 is covered by the wafer, so that the adjustment plate 203 cannot directly receive the light of the heat supply assembly 201. In this case, the adjustment plate 203 has the first light transmittance, for example, a normal light transmittance. Therefore, during manufacturing process, the temperature measurement of the temperature measuring assembly 205 will not be affected. As shown in FIG. 5B, when there is no wafer in the chamber 202, the side of the adjustment plate 203 adjacent to the heat supply assembly 201 is not covered, so that the adjustment plate 203 can directly receive the light provided by the heat supply assembly 201. In this case, the adjustment plate 203 has the second light transmittance. In some embodiments, the first light transmittance is greater than the second light transmittance. For example, the adjustment plate 203 with the second light transmittance is an adjustment plate 203 having a poor light transmittance. Due to the adjustment plate 203 having the poor light transmittance, the light generated by the heat supply assembly 201 cannot penetrate the adjustment plate 203 to directly leak to the temperature measuring assembly 205, so that the temperature measurement of the temperature measuring assembly 205 is not too large and tends to be accurate.

In some embodiments, when the adjustment plate 203 has the second light transmittance, emissivity of the adjustment plate 203 is same as emissivity of the wafer to be processed W.

It may be understood that, if the adjustment plate 203 has the second light transmittance and the adjustment plate 203 and the wafer to be processed W have the same emissivity, the adjustment plate 203 may simulate the blackbody radiation of the wafer. In this case, the temperature measured by the temperature measuring assembly 205 may characterize the temperature at which the wafer to be processed W will be heated during subsequent annealing, and which temperature has guiding significance to the calibration of the temperature measuring assembly 205. It is apparent that, even if the emissivity of the adjustment plate 203 is different from the emissivity of the wafer to be processed W, the temperature at which the wafer to be processed W will be heated during subsequent annealing may also be calculated through the relationship conversion of the emissivity.

Figure 5C:
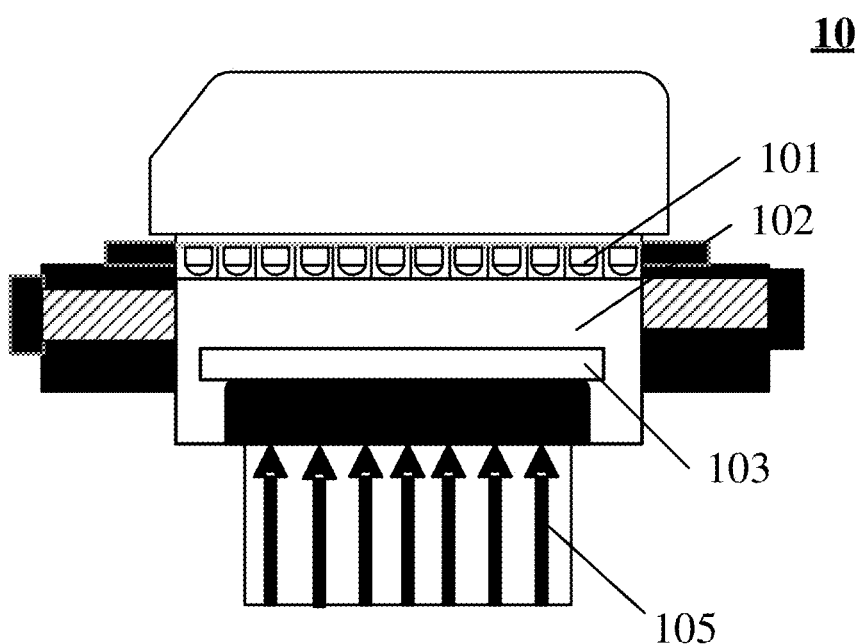
FIG. 5C is a schematic cross-sectional view showing that there is no wafer in a chamber of an RTP device according to an embodiment of the present disclosure.

It is to be noted that, for ease of comparison with the foregoing embodiments, FIG. 5C is a schematic cross-sectional view showing that there is not wafer in the chamber of the RTP device 10 in the foregoing embodiments. As shown in FIG. 5C, when there is no wafer in the chamber 102, a side of the quartz cover plate 103 adjacent to the plurality of halogen lamps 101 is not covered, so that the quartz cover plate 103 can directly receive the light provided by the plurality of halogen lamps 101. At this time, the quartz cover plate 103 has a normal light transmittance, and the light generated by the plurality of halogen lamps 101 penetrate the quartz cover plate 103 to directly leak to the optical thermometer 105, so that the temperature measurement of the optical thermometer is larger than the actual temperature in the chamber.

Herein, the temperature measuring assembly 205 is located under the adjustment plate 203, and is a non-contact temperature measuring device, and the temperature measuring assembly is configured to receive heat radiation and output a temperature measured according to the received heat radiation.

In some embodiments, the temperature measuring assembly includes at least one of an optical thermometer, a radiation thermometer or a colorimetric thermometer.

It is to be noted that, in this embodiment, the RTP device may further include the other components such as a reflective plate.

In this embodiment of the present disclosure, an adjustment plate with variable color is provided. For example, the adjustment plate is manufactured by adding the photochromic material in the ceramic material. The photochromics has a variable absorption coefficient, and may change from one structure to another structure under the action of light with different wavelengths, to cause a reversible change in the color of the ceramic material. By means of such a reversible change, a real temperature of the chamber can be detected by the temperature measuring assembly when there is no wafer in a chamber, so that the calibration of temperature measurement of the temperature measuring assembly can be realized before the manufacturing process. When there is a wafer in the chamber, a temperature of the wafer in the chamber can be detected by the temperature measuring assembly, so that temperature measurement of the temperature measuring assembly during manufacturing process are not affected. Therefore, the RTP device provided in this embodiment of the present disclosure can better meet requirements in actual application.

An embodiment of the present disclosure further provides a method for measuring temperature. The method is applied to the semiconductor device provided in the embodiments of the present disclosure, and includes the following operations.

An output temperature of a temperature measuring assembly is acquired in a case that a wafer to be processed is not placed on a bearing component. The output temperature characterizes a temperature at which the wafer to be processed is heated when the wafer to be processed is placed on the bearing component.

Herein, the foregoing embodiments have described how the semiconductor device can acquire, in a case that the wafer to be processed is not placed on the bearing component, the temperature at which the wafer to be processed is heated when the wafer to be processed is placed on the bearing component, and details are not described herein again.

An embodiment of the present disclosure further provides a processing method for a semiconductor device. The semiconductor device includes the semiconductor device provided in the embodiments of the present disclosure. The processing method includes the following operations.

A first instruction indicating that the semiconductor device is about to perform a process for processing a semiconductor is received.

A power of the heat supply assembly is set at a first power.

A first output temperature of a temperature measuring assembly is acquired in a case that a wafer to be processed is not placed on a bearing component.

According to a state of the first output temperature, it is determined whether the semiconductor device can directly perform semiconductor processing.

Figure 6:
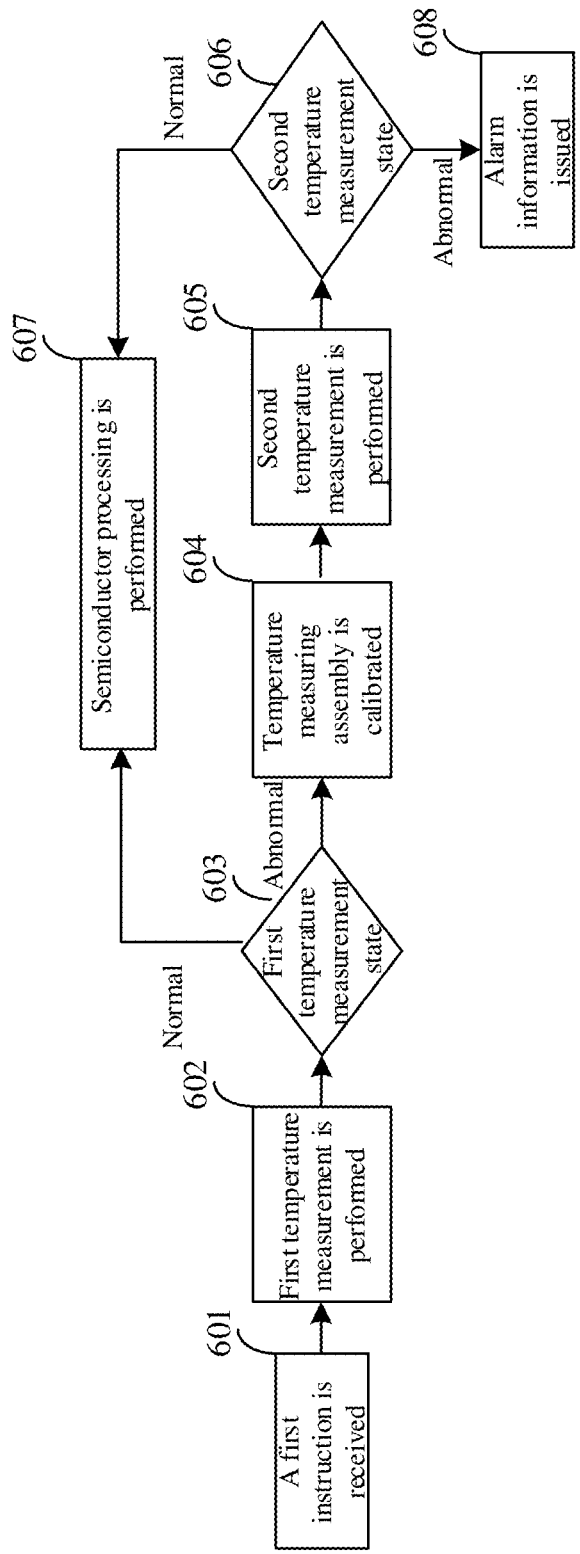
FIG. 6 is a schematic flowchart of a processing method for a semiconductor device according to an embodiment of the present disclosure.

FIG. 6 is a schematic flowchart of a processing method for a semiconductor device according to an embodiment of the present disclosure. The processing method performed by the semiconductor device in the embodiments of the present disclosure is described in detail below with reference to FIG. 6.

It is to be noted that, an executive body of the processing method in this embodiment is said another semiconductor device described above.

The RTP device is taken as an example of the semiconductor device.

As shown in FIG. 6, at 601, the RTP device receives a first instruction, transmitted by a hose computer, for perform semiconductor processing on a batch of wafers to be processed. Herein, semiconductor processing may include, but not limited to, thermal oxidation process, high temperature immersion annealing process, low temperature immersion annealing process, or peak annealing.

Before semiconductor processing is performed on the batch of the wafer to be processed by the RTP device, it is required to determine whether the RTP device can be directly perform the semiconductor processing, that is, whether a calibration operation is required to be performed on the temperature measuring assembly at first.

In response to the first instruction, a power of the heat supply assembly is set at a first power.

In some embodiments, the first power is 4% to 14% of a maximum power of the heat supply assembly. A typical value of the first power may be 9% of a maximum power of the heat supply assembly.

Next, continuously referring to FIG. 6, at 602, first temperature measurement is performed on the temperature measuring assembly. When the first temperature measurement is performed, the wafer to be processed is not placed on the bearing component.

A first output temperature of the temperature measuring assembly is acquired under condition that the heat supply assembly is set at the first power and the wafer to be processed is not placed on the bearing component. Then, at 603, a first temperature measurement state is determined.

In some embodiments, the operation of determining, according to the state of the first output temperature, whether the semiconductor device can directly perform the semiconductor processing includes the following operations.

If the first output temperature is within a first preset temperature range, it is determined that the state of the first output temperature is normal, and that the semiconductor device can directly perform semiconductor processing.

If the first output temperature is not within the first preset temperature range, it is determined that the state of the first output temperature is abnormal, and that the semiconductor device cannot directly perform semiconductor processing.

Herein, the first preset temperature range may be a certain range of temperature closer to the temperature at which the wafer to be processed is heated when the heat supply assembly is set at the first power and the wafer to be processed is placed on the bearing component. The certain range here may be adjusted according to the accuracy of the RTP device, such as ±2° C.

If the first output temperature is within the first preset temperature range, it is determined that the state of the first output temperature is normal, and that the semiconductor device can directly perform semiconductor processing, so that operation 607 may be performed. If the first output temperature is not within the first preset temperature range, it is determined that the state of the first output temperature is abnormal, and that the semiconductor device cannot directly perform semiconductor processing, so that the temperature measuring assembly in the semiconductor device is calibrated, that is, performing the operation 604.

In particular, the temperature measuring assembly may be calibrated according to the deviation of the first output temperature relative to the first preset temperature range. After calibration, second temperature measurement is required to be further performed.

In some embodiments, after the temperature measuring assembly in the semiconductor device is calibrated, the method further includes the following operations.

A heat supply assembly is set at a second power.

A second output temperature of the temperature measuring assembly is acquired in a case that the wafer to be processed is not placed on a bearing component.

According to a state of the second output temperature, it is determined whether the semiconductor device can perform semiconductor processing.

Herein, after the temperature measuring assembly is calibrated, the heat supply assembly is set at a second power.

In some embodiments, the second power is greater than or equal to the first power.

In some embodiments, the second power ranges from 15% to 25% of the maximum power of the heat supply assembly. A typical value of the second power may be 20% of the maximum power of the heat supply assembly.

Continuously referring to FIG. 6, at 605, a second temperature measurement is performed by the temperature measuring assembly. When the second temperature measurement is performed, the wafer to be processed is not placed on the bearing component.

A second output temperature of the temperature measuring assembly is acquired under conditions that the heat supply assembly is set at the second power and the wafer to be processed is not placed on the bearing component. Then, at 606, a second temperature measurement state is determined.

In some embodiments, the operation of determining, according to the state of the second output temperature, whether the semiconductor device can perform semiconductor processing, includes the following operations.

If the second output temperature is within a second preset temperature range, it is determined that the state of the second output temperature is normal, and that the semiconductor device can perform semiconductor processing.

If the second output temperature is not within the second preset temperature range, the state of the second output temperature is abnormal, and that the semiconductor device cannot be currently configured to perform semiconductor processing is determined.

Herein, the second preset temperature may be a certain range of temperatures closer to the temperature at which the wafer to be processed is heated when the heat supply assembly is set at the second power and the wafer to be processed is placed on the bearing component. The certain range here may be adjusted according to the accuracy of the RTP device, such as ±2° C.

If the second output temperature is within the second preset temperature range, it is determined that the state of the second output temperature is normal, and that the semiconductor device can directly perform semiconductor processing, so that operation 607 is performed. If the second output temperature is not within the second preset temperature range, it is determined that the state of the second output temperature is abnormal, that the semiconductor device cannot directly perform semiconductor processing, and that currently the semiconductor device cannot perform semiconductor processing, so that alarm information is issued, that is, operation 608 is performed.

The alarm information here may indicate that the temperature measurement of the temperature measuring assembly is inaccurate and calibration is failed, so that further action is required, for example, re-calibration, and returning to factory for repair.

Since the heat supply assembly is generally set at 9% of the maximum power when the wafer is not placed in the RTP device, the temperature measuring assembly cannot achieve the detection of the real temperature of the chamber and real-time calibration when there is no wafer in the chamber at this power, so that before the semiconductor processing, the calibration and temperature measurement are required to be performed in the chamber at a specific power (15% to 25%) of the heat supply assembly. In this case, the temperature measuring assembly is checked according to an inherent emissivity of the adjustment plate. If there is a deviation in temperature, calibration is performed, so as to perform semiconductor processing without affecting.

The wafer to be processed involved in this embodiment of the present disclosure may be used to product various semiconductor devices, such as a dynamic random access memory.

It is to be understood that "one embodiment" and "an embodiment" mentioned in the whole specification mean that specific features, structures or characteristics related to the embodiment is included in at least one embodiment of the present disclosure. Therefore, "in one embodiment" or "in an embodiment" appearing at any place of the whole specification does not always refer to the same embodiment. In addition, these specific features, structures or characteristics may be combined in one or more embodiments in any proper manner. It is to be understood that, in various embodiments of the present disclosure, the sequence number of each process does not mean the sequence of execution. The execution sequence of each process should be determined by its functions and internal logic, which should not constitute any limitation on the implementation process of the embodiments of the present disclosure. The serial numbers of the foregoing embodiments of the present disclosure are merely for description, and do not represent the superiority or inferiority of the embodiments.

The methods disclosed in several method embodiments provided by the present disclosure can be combined arbitrarily without conflict to obtain a new method embodiment.

The above is only the specific implementations of the present disclosure and not intended to limit the scope of protection of the present disclosure. Any variations or replacements apparent to those skilled in the art within the technical scope disclosed by the present disclosure shall fall within the scope of protection of the present disclosure. Therefore, the protection scope of the present disclosure shall be subject to the protection scope of the claims.

The invention claimed is:

1. A semiconductor device, comprising:
    a chamber, comprising a bearing component configured to place a wafer to be processed;
    a heat supply assembly, located above the chamber and configured to supply heat to the chamber;
    an adjustment plate, located in the chamber and under the bearing component; and
    a temperature measuring assembly, located under the adjustment plate, and configured to receive heat radiation and output a temperature measured according to the received heat radiation, wherein
    the adjustment plate has a first light transmittance when the wafer to be processed is placed on the bearing component, and the temperature measuring assembly is configured to receive the heat radiation that is emitted by the wafer to be processed and passes through the adjustment plate;
    the adjustment plate has a second light transmittance when the wafer to be processed is not placed on the bearing component, and the temperature measuring assembly is configured to receive the heat radiation emitted by the adjustment plate; and
    the first light transmittance is different from the second light transmittance.

2. The semiconductor device of claim 1, wherein the first light transmittance is greater than the second light transmittance.

3. The semiconductor device of claim 1, wherein, when the adjustment plate has the second light transmittance, emissivity of the adjustment plate is same as emissivity of the wafer to be processed.

4. The semiconductor device of claim 1, wherein a material of the adjustment plate comprises a ceramic material and a photochromic material, and a light transmittance of the adjustment plate is variable according to different wavelengths of light acted on the adjustment plate.

5. The semiconductor device of claim 4, wherein the ceramic material comprises at least one of quartz, alumina, silicon carbide, or sapphire; and the photochromic material comprises at least one of an acetylenic compound, spiropyrane, spirooxazine, a triarylmethane compound, hexaphenyl biimidazole, a salicylaldehyde aniline compound, a perinaphthene indigo dye, an azo compound, a fused ring aromatic compound, thiazides, fulgide, or diarylethene.

6. The semiconductor device of claim 4, wherein the photochromic material is located on a surface of the ceramic material, or the photochromic material is doped in the ceramic material.

7. The semiconductor device of claim 1, wherein the heat supply assembly comprises at least one of a halogen lamp, an ultraviolet lamp, a laser diode, a resistance heater, a microwave power heater, a light emitting diode, a quartz lamp, an arc lamp, a resistance wire, or a heating wire.

8. The semiconductor device of claim 1, wherein the temperature measuring assembly comprises at least one of an optical thermometer, a radiation thermometer, or a colorimetric thermometer.

9. The semiconductor device of claim 1, comprising a Rapid Thermal Processing (RTP) device.

10. A method for measuring temperature, applied in the semiconductor device of claim 1 and comprising:
    acquiring an output temperature of the temperature measuring assembly in a case that the wafer to be processed is not placed on the bearing component, wherein the output temperature characterizes a temperature at which the wafer to be processed is heated when the wafer to be processed is placed on the bearing component.

11. A processing method for a semiconductor device, wherein the semiconductor device comprises the semiconductor device of claim 1, and the processing method comprises:
    receiving a first instruction indicating that the semiconductor device is about to perform a process for processing a semiconductor;
    setting the heat supply assembly at a first power;
    acquiring a first output temperature of the temperature measuring assembly in a case that the wafer to be processed is not placed on the bearing component; and
    determining, according to a state of the first output temperature, whether the semiconductor device can directly perform the process for processing a semiconductor.

12. The processing method of claim 11, wherein the first power is 4% to 14% of a maximum power of the heat supply assembly.

13. The processing method of claim 11, wherein the determining, according to the state of the first output temperature, whether the semiconductor device can directly perform the process for processing a semiconductor comprises:
    responsive to the first output temperature within a first preset temperature range, determining that the state of the first output temperature is normal, and that the semiconductor device can directly perform the process for processing the semiconductor; and
    responsive to the first output temperature not within the first preset temperature range, determining that the state of the first output temperature is abnormal, and that the semiconductor device cannot directly perform the process for processing the semiconductor.

14. The processing method of claim 13, further comprising:
    responsive to determining that the semiconductor device cannot directly perform the process for processing the semiconductor, calibrating the temperature measuring assembly in the semiconductor device.

15. The processing method of claim 14, wherein, after the temperature measuring assembly in the semiconductor device is calibrated, the processing method further comprises:
    setting the heat supply assembly at a second power;
    acquiring a second output temperature of the temperature measuring assembly in a case that the wafer to be processed is not placed on the bearing component; and
    determining, according to a state of the second output temperature, whether the semiconductor device can perform the process for processing the semiconductor.

16. The processing method of claim 15, wherein the second power is greater than or equal to the first power.

17. The processing method of claim 16, wherein the second power ranges from 15% to 25% of a maximum power of the heat supply assembly.

18. The processing method of claim 15, wherein the determining, according to the state of the second output temperature, whether the semiconductor device can perform the process for processing the semiconductor comprises:
    responsive to the second output temperature within a second preset temperature range, determining that the state of the second output temperature is normal, and that the semiconductor device can perform the process for processing the semiconductor; and
    responsive to the second output temperature not within the second preset temperature range, determining that the state of the second output temperature is abnormal, and that the semiconductor device still cannot perform the process for processing the semiconductor.

19. The processing method of claim 18, further comprising:
    responsive to determining that the semiconductor device still cannot perform the process for processing the semiconductor, issuing alarm information.

* * * * *